United States Patent
Dole et al.

(10) Patent No.: US 10,847,377 B2
(45) Date of Patent: *Nov. 24, 2020

(54) METHOD OF ACHIEVING HIGH SELECTIVITY FOR HIGH ASPECT RATIO DIELECTRIC ETCH

(71) Applicant: Lam Research Corporation, Fremont, CA (US)

(72) Inventors: Nikhil Dole, Union City, CA (US); Takumi Yanagawa, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/688,639

(22) Filed: Nov. 19, 2019

(65) Prior Publication Data

US 2020/0090945 A1    Mar. 19, 2020

Related U.S. Application Data

(63) Continuation of application No. 16/019,330, filed on Jun. 26, 2018, now Pat. No. 10,515,821.

(51) Int. Cl.
*H01L 21/311* (2006.01)
*H01L 21/3213* (2006.01)
*H01J 37/32* (2006.01)
*H01J 37/20* (2006.01)

(52) U.S. Cl.
CPC ........ *H01L 21/31116* (2013.01); *H01J 37/20* (2013.01); *H01J 37/32091* (2013.01); *H01J 37/32449* (2013.01); *H01J 37/32568* (2013.01); *H01L 21/31144* (2013.01); *H01L 21/32133* (2013.01)

(58) Field of Classification Search
None
See application file for complete search history.

(56) References Cited

U.S. PATENT DOCUMENTS

| | | | |
|---|---|---|---|
| 5,948,704 | A | 9/1999 | Benjamin et al. |
| 7,732,728 | B2 | 6/2010 | Dhindsa et al. |
| 7,740,736 | B2 | 6/2010 | Fischer et al. |
| 9,620,377 | B2 | 4/2017 | Hudson et al. |
| 9,673,058 | B1 | 6/2017 | Briggs et al. |
| 10,515,821 | B1 | 12/2019 | Dole et al. |

(Continued)

OTHER PUBLICATIONS

U.S. Appl. No. 16/165,471, filed Oct. 19, 2018, Dole et al.

(Continued)

*Primary Examiner* — Allan W. Olsen
(74) *Attorney, Agent, or Firm* — Weaver Austin Villeneuve & Sampson LLP

(57) ABSTRACT

Various embodiments herein relate to methods and apparatus for etching a feature in a substrate. Often, the feature is etched in the context of forming a DRAM device. The feature is etched in dielectric material, which often includes silicon oxide. The feature is etched using chemistry that includes $WF_6$. Although $WF_6$ is commonly used as a deposition gas (e.g., to deposit tungsten-containing film), it can also be used during etching. Advantageously, the inclusion of $WF_6$ in the etch chemistry can increase the etch rate of the dielectric material, as well as increase the selectivity of the etch. Unexpectedly, these benefits can be realized without any increase in capping.

20 Claims, 13 Drawing Sheets

(56) References Cited

U.S. PATENT DOCUMENTS

| | | |
|---|---|---|
| 2011/0151670 A1 | 6/2011 | Lee et al. |
| 2013/0157470 A1 | 6/2013 | Watanabe et al. |
| 2014/0220785 A1 | 8/2014 | Watanabe et al. |
| 2015/0050807 A1 | 2/2015 | Wu et al. |
| 2018/0327913 A1 | 11/2018 | Lansalot-Matras et al. |
| 2019/0074191 A1 | 3/2019 | Nagatomo et al. |
| 2019/0393047 A1 | 12/2019 | Dole et al. |
| 2020/0126804 A1 | 4/2020 | Dole et al. |

OTHER PUBLICATIONS

U.S. Appl. No. 16/019,330, filed Jun. 26, 2018, Dole et al.
Office Action dated May 13, 2019 issued in U.S. Appl. No. 16/019,330.
Notice of Allowance dated Aug. 23, 2019 issued in U.S. Appl. No. 16/019,330.
Office Action dated Dec. 30, 2019 issued in U.S. Appl. No. 16/165,471.
Notice of Allowance dated Apr. 3, 2020 issued in U.S. Appl. No. 16/165,471.

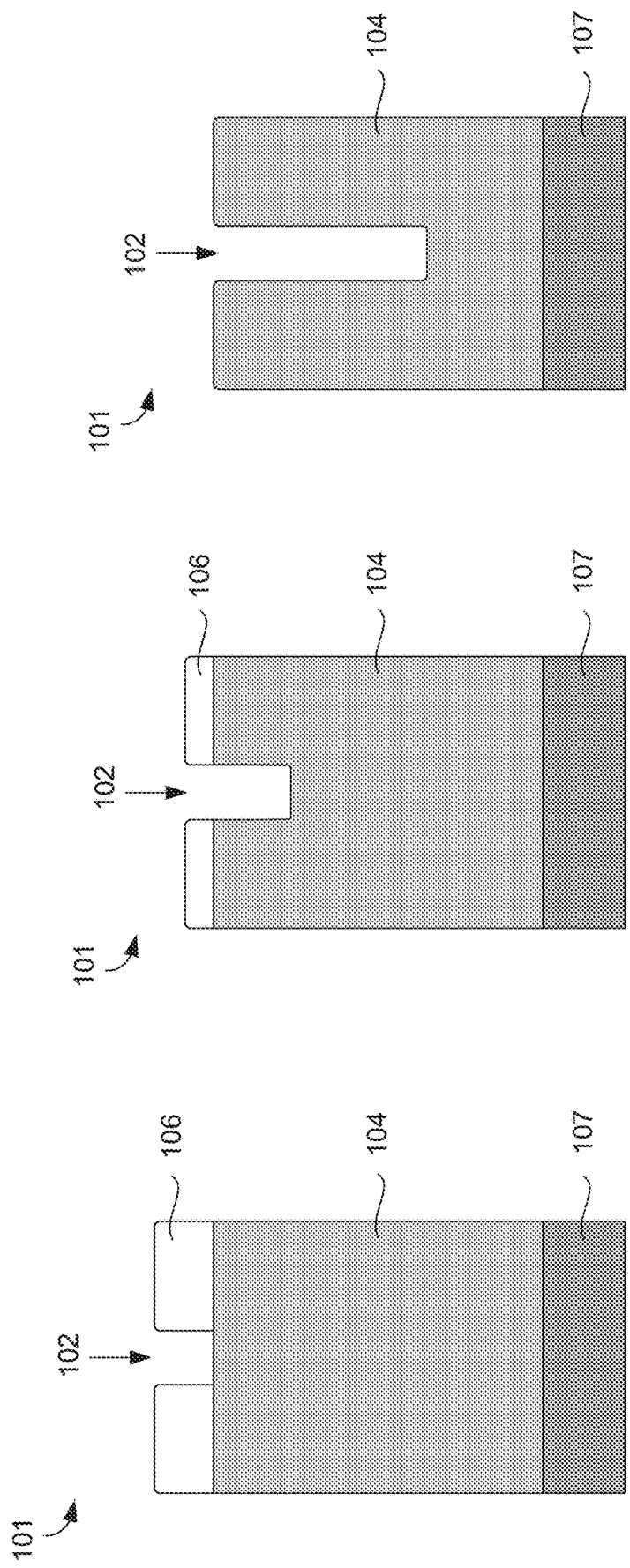

METHOD OF ACHIEVING HIGH SELECTIVITY FOR HIGH ASPECT RATIO DIELECTRIC ETCH

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

FIELD

Embodiments herein relate to methods and apparatus for fabricating a semiconductor device, and more particularly, for etching high aspect ratio features into dielectric material with a high degree of selectivity with respect to a mask material that defines the features.

BACKGROUND

One process frequently employed during fabrication of semiconductor devices is formation of an etched cylinder or other recessed feature in dielectric material. For instance, such processes are commonly used in memory applications such as fabricating dynamic random access memory (DRAM) structures. As the semiconductor industry advances and device dimensions become smaller, such features are increasingly difficult to etch in a uniform manner, especially for high aspect ratio cylinders having narrow widths and/or deep depths.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Certain embodiments herein relate to methods and apparatus for etching a feature in dielectric material on a semiconductor substrate in the context of forming a memory structure.

In one aspect of the disclosed embodiments, a method of etching a feature in dielectric material on a substrate while fabricating a memory structure is provided, the method including: receiving the substrate on a substrate support in a reaction chamber, the substrate including the dielectric material under a mask layer that is patterned, the dielectric material including silicon oxide; and exposing the substrate to a plasma in the reaction chamber to thereby etch the feature in the dielectric material on the substrate, where the plasma is generated from a plasma generating gas including $WF_6$, one or more fluorocarbons, and oxygen ($O_2$), where the plasma is a capacitively coupled plasma generated at an excitation frequency between about 13-169 MHz at an RF power level between about 5-20 kW per substrate, where the substrate is biased at a frequency between about 50 kHz and 10 MHz at an RF power level between about 500 W and 60 kW per substrate, where the reaction chamber is maintained at a pressure between about 10-500 mTorr during etching, and where the substrate support is maintained at a temperature between about −80° C. and 130° C. while the substrate is exposed to the plasma.

In certain implementations, the substrate support is maintained at a temperature between about 60-120° C. while the substrate is exposed to the plasma. In these or other cases, the substrate support may be maintained at a temperature of at least about 80° C. while the substrate is exposed to the plasma. In various embodiments, the substrate may be biased at an RF power level of at least about 13 kW per substrate. In these or other embodiments the substrate may be biased at an RF power level of about 17 kW or less.

In many cases, the flow rate of WF6 in the plasma generating gas is relatively low. For example, in some cases the flow rate of $WF_6$ in the plasma generating gas may be about 20 sccm or less. In some cases, flow rate of $WF_6$ in the plasma generating gas may be about 10 sccm or less. In certain cases, the flow rate of $WF_6$ in the plasma generating gas is about 2 sccm or less.

The method may achieve one or more benefits. For example, in various embodiments, the method occurs without capping any features on the substrate. In these or other cases, a selectivity of the etch is at least about 3.0, the selectivity being defined as an etch rate of the silicon oxide divided by an etch rate of the mask layer, where the mask layer includes polysilicon.

In certain cases, the dielectric material may be provided in a dielectric stack including at least a first layer of silicon oxide and at least a first layer of silicon nitride, the first layer of silicon oxide being positioned below the first layer of silicon nitride, where the first layer of silicon nitride is etched prior to exposing the substrate to the plasma including the $WF_6$ to etch the first layer of silicon oxide. In some such cases, the method may further include etching the first layer of silicon nitride without the use of $WF_6$, prior to etching the first layer of silicon oxide. The dielectric stack may further include a second layer of silicon oxide positioned above the first layer of silicon nitride, the method further including etching the second layer of silicon oxide using plasma including $WF_6$. In other cases, the dielectric stack may further include a second layer of silicon oxide positioned above the first layer of silicon nitride, the method further including etching the second layer of silicon oxide using plasma that does not include $WF_6$.

In some cases, the $WF_6$ may dissociate in the plasma into tungsten-containing fragments and fluorine-containing fragments, and the tungsten-containing fragments may preferentially attach to upper sidewalls of the feature compared to lower sidewalls of the feature, and the fluorine-containing fragments may travel to the bottom of the feature to further etch the feature.

In another aspect of the disclose embodiments, an apparatus for etching a feature in dielectric material on a substrate while fabricating a memory structure is provided, the apparatus including: a reaction chamber including: an inlet for introducing process gases to the reaction chamber, an outlet for removing material from the reaction chamber, a substrate support, and a plasma source configured to provide a plasma to the reaction chamber, the plasma being a capacitively coupled plasma; and a controller configured to cause: receiving the substrate on the substrate support in the reaction chamber, the substrate including the dielectric material under a mask layer that is patterned, the dielectric material including silicon oxide, maintaining a pressure of about 100 mTorr or less in the reaction chamber, generating the plasma in the reaction chamber from a plasma generating gas including $WF_6$, one or more fluorocarbons, and oxygen ($O_2$), the plasma being generated at an RF excitation frequency between about 13-169 MHz and at an RF power level between about 5-20 kW per substrate, biasing the substrate at an RF frequency between about 50 kHz and 10 MHz and at an RF power level between about 500 W and 60 kW per substrate, and exposing the substrate to the plasma in the reaction chamber while biasing the substrate to thereby etch the feature in the dielectric material on the substrate, where the substrate support is maintained at a temperature between about −80° C. and 130° C. while the substrate is exposed to the plasma.

These and other features will be described below with reference to the associated drawings.

BRIEF DESCRIPTION OF THE DRAWINGS

FIGS. 1A-1C depict a partially fabricated DRAM structure as a feature is etched into dielectric material.

DETAILED DESCRIPTION

Figure 2A:
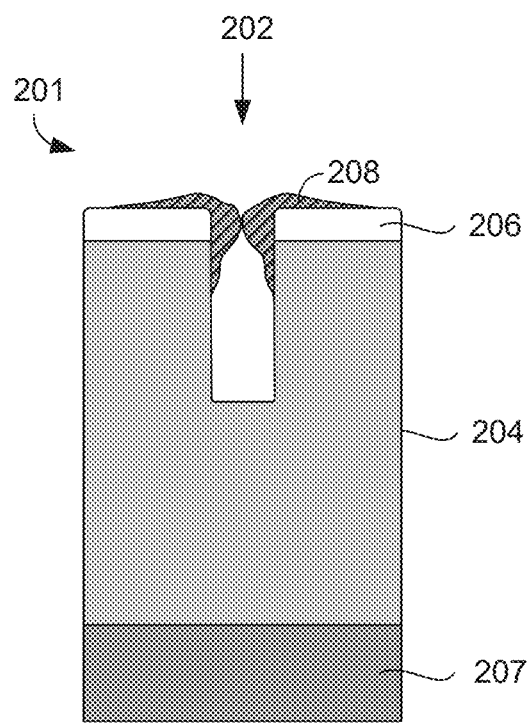
FIG. 2A illustrates a partially etched feature that has become capped.

FIGS. 1A-1C depict a partially fabricated DRAM structure as a high aspect ratio feature 102 is etched into a dielectric material layer 104 on a substrate 101. The figures are not drawn to scale. FIG. 1A shows the substrate 101 before etching begins. The substrate includes a patterned mask layer 106 overlying the dielectric material layer 104. An underlying layer 107 is provided under the dielectric material layer 104. In various examples, the patterned mask layer 106 may have a thickness between about 300-800 nm, or between about 400-600 nm, and the dielectric material layer 104 may have a thickness between about 0.6-1.1 μm. The mask material may be polysilicon, amorphous carbon, or another common mask material known in the art. The dielectric material layer 104 typically includes silicon oxide. The underlying layer 107 may be a layer of silicon nitride, for example. In some cases, the dielectric material layer 104 may be a stack of materials including one or more layers of silicon oxide and one or more layers of silicon nitride. The silicon nitride layers may be relatively thin compared to the silicon oxide layers. In a particular example, the dielectric material layer 104 includes an upper layer of silicon nitride and a lower layer of silicon oxide (with the oxide being thicker than the nitride). In a similar example, the dielectric material layer 104 further includes a lower layer of silicon nitride, with the silicon oxide layer being sandwiched between the upper and lower layers of silicon nitride. The pitch between adjacent features 102 may be about 50 nm or less. The critical diameter (e.g., diameter) of the features 102 may be between about 10-30 nm, in some cases between about 15-30 nm.

The substrate 101 shown in FIG. 1A is provided to a semiconductor processing apparatus for etching. An appropriate apparatus is described further below. After the substrate is introduced to the processing apparatus, a plasma is generated in the processing apparatus. The plasma may interact directly with the substrate to cause etching on the substrate. After a period of time, a feature 102 begins to form in the dielectric material layer 104, as shown in FIG. 1B. While the patterned mask layer 106 is somewhat resistant to the etching conditions, it still experiences some etching/erosion during this process. As such, the patterned mask layer 106 shown in FIG. 1B is thinner than the patterned mask layer 106 shown in FIG. 1A.

FIG. 1C shows the substrate 101 just after the patterned mask layer 106 is substantially fully removed as a result of prolonged exposure to the etching conditions. At this point the feature 102 is deeper than the one shown in FIG. 1B, but it still does not extend all the way through the dielectric material layer 104. The feature 102 cannot be etched any deeper because the patterned mask layer 106 has been substantially fully removed. Any further etching would substantially erode the dielectric material layer 104 in an undesirable manner. FIGS. 1A-1C illustrate one of the problems frequently encountered when etching high aspect ratio features. Often, various processing considerations limit the thickness of the mask layer that can be used for a particular application. This limits the depth of the features that can be formed using the patterned mask layer.

One technique for etching deeper holes without increasing the mask thickness is to increase the selectivity of the etch process. The selectivity is calculated as a ratio between the etch rate of the dielectric material and the etch rate of the mask material. For instance, if the dielectric material etches three times faster than the mask material, the etch process has a selectivity of 3:1. The selectivity of the etch process can be increased by increasing the etch rate of the dielectric material relative to the etch rate of the mask layer. Similarly, the selectivity can be increased by decreasing the etch rate of the mask layer relative to the etch rate of the dielectric material.

There are a number of techniques available for increasing the selectivity of the etch process. However, these techniques typically present other drawbacks such as an increase in capping. Capping is also referred to as etch stop, and it occurs when a recessed feature becomes blocked/clogged during an etch process. When a feature becomes clogged, no further etching is achieved for that feature. FIG. 2A illustrates a feature 202 which has become clogged during an etching process. The feature 202 is formed in a dielectric material layer 204, formed between an underlying layer 207 and a patterned mask layer 206. During etching, the etch chemistry interacts with the dielectric material layer 204 to remove the dielectric material and to form a fluorocarbon-based polymer 208 that deposits on the sidewalls of the feature 202. In many cases, the fluorocarbon-based polymer 208 deposits near the top of the feature 202. Where the deposition is substantial, it can cause the blocking/clogging problem illustrated in FIG. 2A.

Figure 2B:
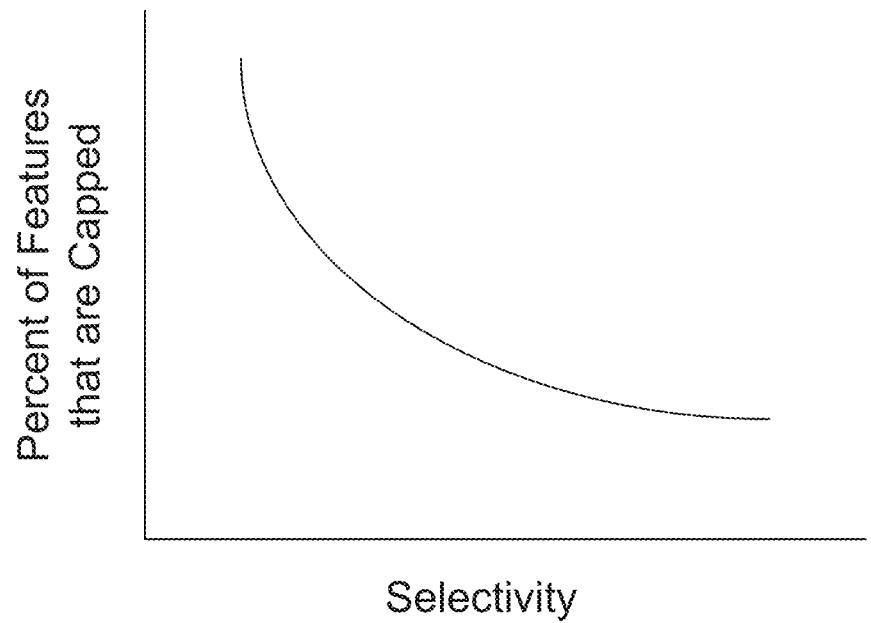
FIG. 2B is a graph describing a tradeoff between selectivity and capping that is commonly faced when trying to optimize an etching process.

Many of the techniques that increase selectivity of the etch result in relatively greater fluorocarbon-based polymer formation on or near the patterned mask layer. This has the desirable effect of reducing the etch rate of the mask material, thereby increasing selectivity. However, this can also have the undesirable effect of capping when there is an excess of fluorocarbon-based polymer. In practice, the tradeoffs between selectivity and capping have limited how deep a high aspect ratio feature can be etched in dielectric material. This tradeoff is shown generally in FIG. 2B, which describes the problem faced in many conventional approaches.

Surprisingly, the inventors have developed a method of etching that improves selectivity without any increase in capping. Such methods enable formation of deeper features without having to increase the thickness of the mask layer. Similarly, such methods enable formation of features at a particular etch depth with a relatively thinner mask than was previously required. As such, the techniques described herein are advantageous for both etching deeper features and for minimizing the amount of mask material required, without risk of capping the features.

In order to increase the selectivity of the etch process, a small flow of tungsten hexafluoride ($WF_6$) is added to the etch chemistry. $WF_6$ is commonly used as a deposition gas, for example to form tungsten-based films using a vapor-based deposition process. $WF_6$ is not commonly used in etching. The addition of $WF_6$ to the etch chemistry, when provided at an appropriate flow rate and under appropriate plasma conditions, increases the etch rate of the dielectric material (e.g., silicon oxide in many cases).

One possible reason that $WF_6$ is not typically used in etching chemistry, particularly in the context of etching a recessed feature for a DRAM device, is that such features are not typically filled with tungsten or tungsten-containing materials. As such, any remaining tungsten, e.g., on the sidewalls or field region of the feature, could be problematic in future processing. Further, there may be a need to remove such materials before further processing can take place.

Without wishing to be bound by theory or mechanism of action, it is believed that the $WF_6$, when exposed to appropriate plasma conditions, breaks into $F_2^*$, $F^*$, and tungsten-containing fragments, for example as shown below in Equations 1-4.

$$WF_6 \rightarrow WF_4 + F_2^* \quad \text{(Equation 1)}$$

$$WF_4 \rightarrow WF_2 + F_2^* \quad \text{(Equation 2)}$$

$$WF_2 \rightarrow W + F_2^* \quad \text{(Equation 3)}$$

$$F_2^* \rightarrow 2F^* \quad \text{(Equation 4)}$$

The $F_2^*$ and $F^*$ have low sticking coefficients and easily travel down to the bottom of the feature to further vertically etch the feature. The tungsten-containing fragments have a much higher sticking coefficient, and typically attach to the top and upper sidewalls of the feature. Once attached, the tungsten-containing fragments help preferentially protect the mask layer, thus reducing the rate at which the mask layer is eroded away. Because the tungsten-containing fragments preferentially attach in regions proximate the mask material (e.g., as opposed to further down the feature where the dielectric material is present), the mask material is preferentially protected (e.g., compared to the dielectric material). The result is a desirable increase in etch selectivity. Advantageously, the tungsten-containing fragments that attach to the top and upper sidewalls of the feature do not cause the capping problem associated with the fluorocarbon-based polymer, described above in relation to FIGS. 2A and 2B.

Figure 3A:
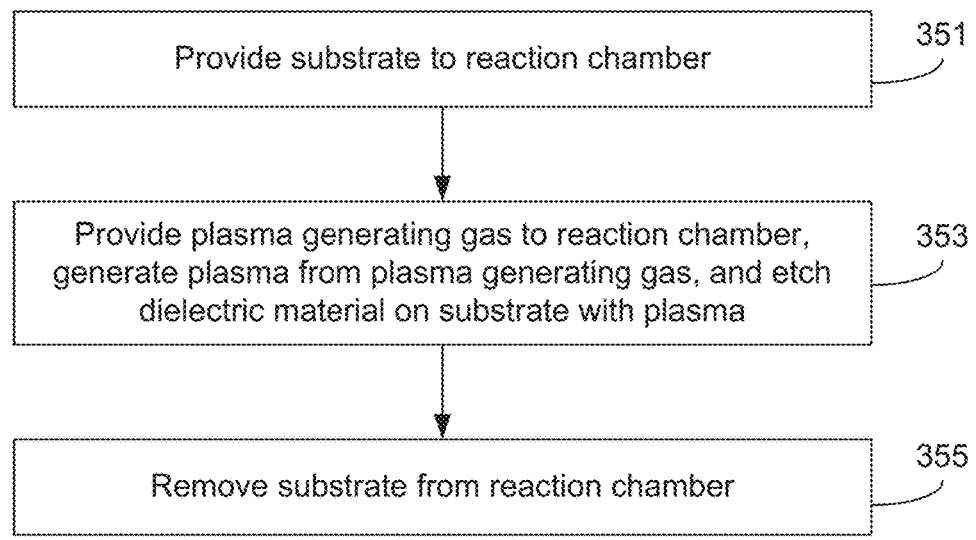
FIG. 3A is a flowchart describing a method of etching a feature for a DRAM structure according to certain embodiments.
Figure 3B:
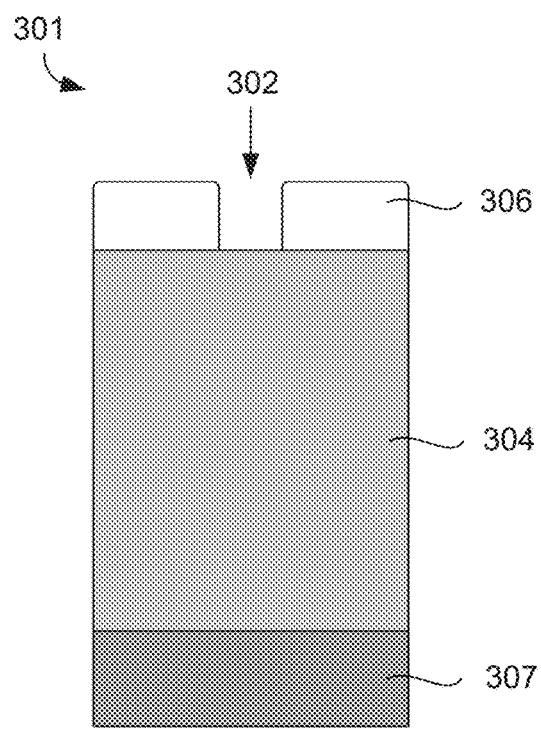
FIGS. 3B and 3C depict a partially fabricated DRAM structure before and after the method of FIG. 3A.
Figure 3C:
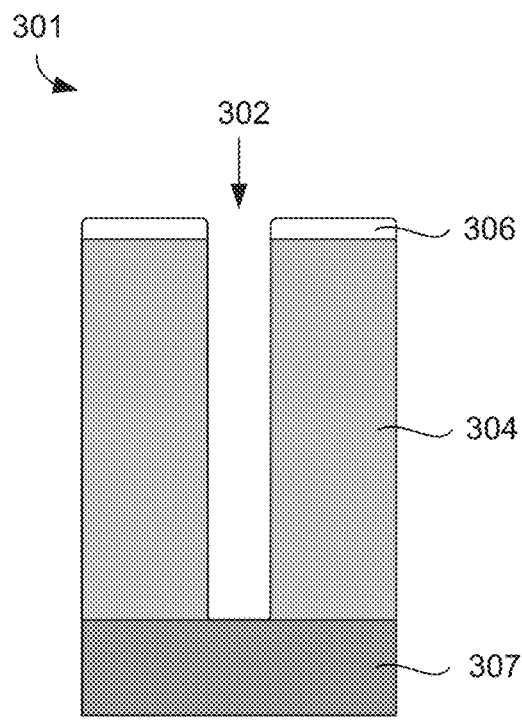

FIG. 3A is a flowchart describing a method of etching a feature in dielectric material according to certain embodiments. The method of FIG. 3A is described in the context of the structures shown in FIGS. 3B and 3C. FIGS. 3B and 3C illustrate a partially fabricated DRAM structure as a high aspect ratio feature 302 is etched into a dielectric material layer 304 on a substrate 301. FIG. 3B shows the substrate 301 before etching begins, and FIG. 3C shows the substrate 301 after the etching is complete. The substrate may have dimensions as described above in relation to FIGS. 1A-1C. Similarly, the dielectric material layer 304 may have any of the structures/compositions described in relation to the dielectric material layer 104 of FIGS. 1A-1C. The substrate 301 includes a patterned mask layer 306 overlying the dielectric material layer 304. An underlying layer 307 is provided under the dielectric material layer 304. In certain examples, the patterned mask layer 306 is polysilicon, and may have a thickness between about 100-1000 nm, for example between about 300-800 nm. In other examples, the patterned mask layer 306 is amorphous carbon, and may have a thickness between about 200-1200 nm, for example between about 300-1000 nm. Other mask materials may be used in some cases. In a number of examples, the dielectric material layer 304 includes silicon oxide. In some such cases, the dielectric material layer 304 is a single layer of silicon oxide (typically relatively thick). In some cases, the dielectric material layer 304 may include additional layers, for example one or more layers of silicon nitride, which may be interleaved between thicker layers of silicon oxide. The underlying layer 307 may be silicon nitride, for example. The final etch depth, as shown in FIG. 3C, is at the underlying layer 307.

The method of FIG. 3A begins with operation 351, where the substrate 301 shown in FIG. 3B is provided to a reaction chamber of a semiconductor processing apparatus. An appropriate apparatus is described further below. After the substrate is introduced to the reaction chamber, a plasma generating gas is provided to a reaction chamber, a plasma is generated from the plasma generating gas, and the plasma etches the dielectric material in operation 353.

The composition of the plasma generating gas may be controlled to achieve a high degree of selectivity during the etch. The flow rate of $WF_6$ may be at least about 0.1 sccm, or at least about 0.2 sccm, or at least about 0.5 sccm, or at least about 1 sccm. In these or other cases, the flow rate of $WF_6$ may be about 20 sccm or less, for example about 10 sccm or less, or about 5 sccm or less, or about 2 sccm or less, or about 1 sccm or less. The plasma generating gas also includes one or more materials conventionally used for etching dielectric material. Such materials commonly include fluorocarbons and hydrofluorocarbons such as $C_3F_8$, $C_4F_8$, $C_4F_6$, $CH_2F_2$, $CH_3F$, $CHF_3$, $C_5F_8$, $C_6F_6$, etc. Such materials can also include oxidants such as $O_2$, $O_3$, CO, $CO_2$, COS, etc. An overall flow rate of the plasma generating gas may be between about 50-500 sccm in various cases. In some cases, one or more fluorocarbon sources may be mixed (prior to or after delivery to the reaction chamber), for example to provide a desired ratio of carbon and fluorine. The plasma generating gas may also include one or more inert species. In various cases, the $WF_6$ may represent at least about 0.02%, or at least about 0.05%, or at least about 0.1%, or at least about 0.5%, or at least about 1% of the volumetric flow rate of the plasma generating gas. In these or other cases, the $WF_6$ may represent about 10% or less, or about 5% or less, or about 1% or less, or about 0.05% or less, of the volumetric flow rate of the plasma generating gas.

In a particular example, the plasma generating gas includes between about 0.1-15 sccm $WF_6$, between about 30-150 sccm $C_4F_6$, between about 20-150 sccm mixed $C_3F_8/C_4F_8$, between about 30-150 sccm $O_2$, and between about 30-90 sccm $CH_2F_2$.

In various cases, the following conditions may be used to generate the plasma. The plasma may be a capacitively coupled plasma. The plasma may be generated at an excitation frequency between about 13-169 MHz, for example between about 40-100 MHz (e.g., 60 MHz in a particular case), at a power level between about 200 to 20,000 Watts per 300 mm substrate. In various cases, the power level used to generate the plasma may be particularly high, for example about 4 kW or greater per 300 mm substrate, or about 5 kW or greater per 300 mm substrate. A relatively high bias may be applied to the substrate, for example to promote a high vertical etch rate. The bias may be applied to the substrate at a frequency between about 50 kHz and 10 MHz, or between about 200 kHz and 4 MHz (e.g., about 400 kHz in a particular case), at a power level between about 500 W and 60 kW per 300 mm substrate, or between about 2-60 kW per 300 mm substrate. In some cases, the power level used to bias the substrate is at least about 13 kW, or at least about 15 kW. In these or other cases, the power level used to bias the substrate may be about 60 kW or less, or about 30 kW or less, or about 20 kW or less, or about 17 kW or less. In a particular embodiment, the substrate is biased at 400 kHz, at a power level between about 13-17 kW. The pressure within the reaction chamber may be at least about 10 mTorr or at least about 30 mTorr. In these or other cases, the pressure within the reaction chamber may be about 500 mTorr or less, for example 100 mTorr or less, or about 80 mTorr or less. In some cases, the pressure may remain relatively low during etching, but increase to a higher pressure (e.g., 100-500 mTorr, or 300-500 mTorr, or 400-500 mTorr) for a cleaning operation to clean the internal walls of the reaction chamber. The substrate support on which the substrate is provided may be maintained at a temperature (e.g., through heating and/or cooling) between about −80° C. and 130° C. In some cases, the substrate support is maintained at a temperature of at least about −80° C., or at least about −50° C., or at least about −20° C., or at least about 0° C., or at least about 20° C., or at least about 50° C., or at least about 60° C., or at least about 70° C. In these or other cases, the substrate support may be maintained at a temperature of about 130° C. or less, or about 120° C. or less, or about 100° C. or less, or about 80° C. or less, or about 50° C. or less, or about 20° C. or less, or about 0° C. or less, or about −20° C. or less, or about −50° C. or less. These temperatures may relate to the controlled temperature of the substrate support while the substrate is exposed to plasma.

After a period of time, a feature 302 begins to form in the dielectric material layer 304. After the feature reaches its final etch depth, as shown in FIG. 3C, the substrate 301 is removed from the reaction chamber in operation 355. As compared with conventional approaches, the method described in relation to FIGS. 3A-3C is capable of forming deeper features without increasing the mask height. Similarly, this method can be used to form features of a particular etch depth using less mask height (e.g., thinner mask layer) than was previously required. The inclusion of $WF_6$ in the plasma generating gas, when provided at an appropriate flow rate and under appropriate plasma conditions, improves the selectivity of the etch. Advantageously, this improvement in selectivity does not increase the rate at which features become capped.

Figure 4A:
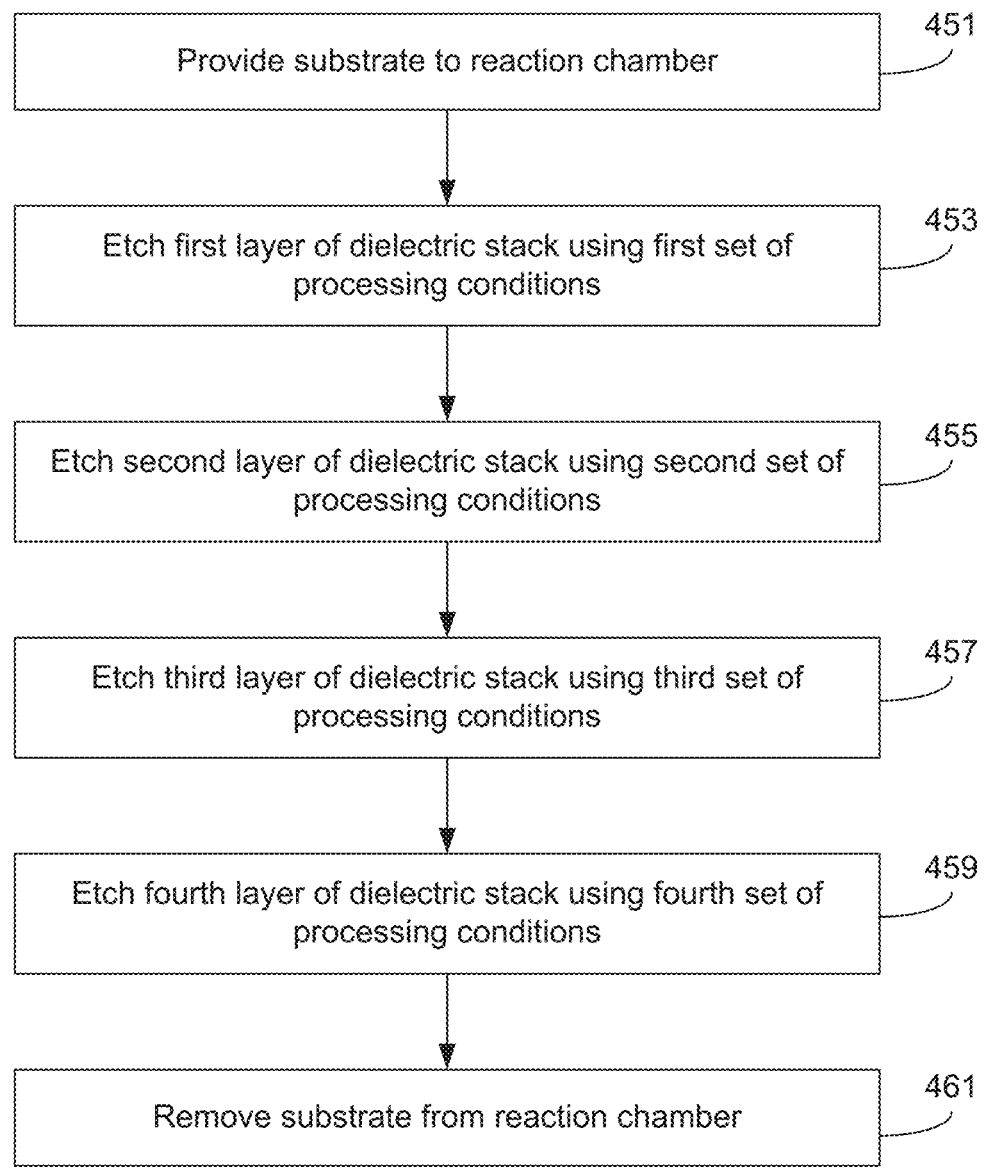
FIG. 4A is a flowchart describing a method of etching a feature for a DRAM structure according to certain embodiments where the etch occurs in steps performed at different processing conditions.
Figure 4B:
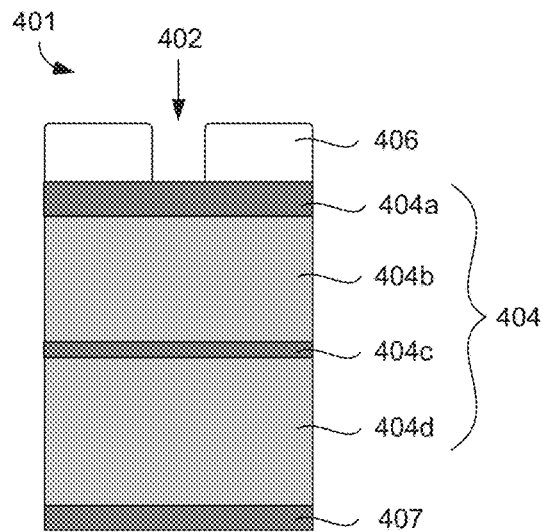
FIGS. 4B-4F depict a partially fabricated DRAM structure as it undergoes the method described in FIG. 4A.

FIGS. 4A-4F describe an embodiment where the etch process proceeds incrementally, with different conditions being applied as different types of layers are being etched. FIG. 4A is a flowchart describing the processing steps, and FIGS. 4B-4F show the substrate 401 as it is being processed according to the method of FIG. 4A. The method begins at operation 451, where the substrate 401 is provided to the reaction chamber. The substrate 401 includes a patterned mask layer 406 with features 402 defined therein, as shown in FIG. 4B. Under the patterned mask layer 406 is a dielectric stack 404. In this example, the dielectric stack 404 includes four individual layers 404a-404d. Layers 404a and 404c are silicon nitride, while layers 404b and 404d are silicon oxide. In a similar example, one or more of these layers may be omitted (e.g., layer 404c). In other examples, additional layers may be provided (e.g., additional layers of silicon oxide and silicon nitride, or other materials). Under the dielectric stack 404 is an underlying layer 407. In this example, underlying layer 407 is silicon nitride.

Figure 4C:
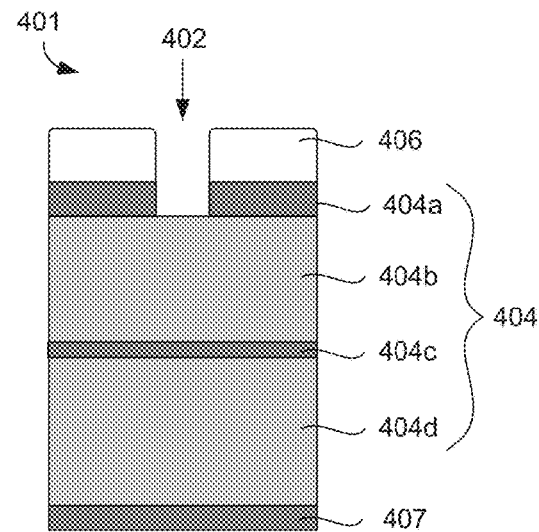

The method continues at operation 453 where the first layer 404a of the dielectric stack is etched using a first set of processing conditions, as shown in FIG. 4C The first set of processing conditions may be optimized for etching the material of the first layer 404a (e.g., silicon nitride). In some cases, the substrate support may be maintained at a temperature between about 20-100° C. (while the substrate is exposed to plasma), the pressure within the reaction chamber is between about 30-80 mTorr, the plasma is generated at an RF excitation frequency between about 13-169 MHz (e.g., 60 MHz) at a power level between about 1-6 kW, the substrate is biased at an RF frequency between about 200 kHz to 4 MHz (e.g., 400 kHz) at a power level between about 2-8 kW, and the plasma generating gas includes at least (a) one or more fluorocarbons and/or hydrofluorocarbons as described herein, and (b) one or more oxidant such as $O_2$. In certain embodiments, the plasma generating gas for the first set of processing conditions further includes $WF_6$. In other embodiments, the plasma generating gas for the first set of processing conditions does not include $WF_6$.

Figure 4D:
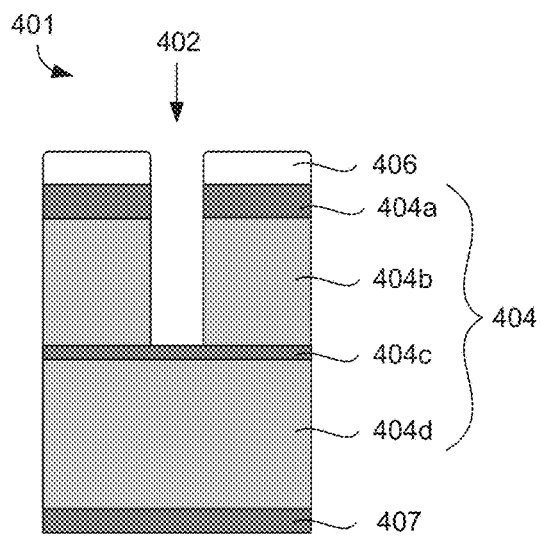

After the first layer 404a of the dielectric stack is etched, the method continues at operation 455 where the second layer 404b of the dielectric stack is etched using a second set of processing conditions, as shown in FIG. 4D. The second set of processing conditions may be optimized for etching the material of the second layer 404b (e.g., silicon oxide). In some cases, the substrate support is maintained at a temperature between about −80° C. and 130° C. (e.g., 50-130° C.) while the substrate is exposed to plasma, the plasma is generated at an RF excitation frequency between about 13-169 MHz (e.g., 60 MHz) at a power level between about 5-20 kW the substrate is biased at an RF frequency between about 50 kHz to 10 MHz (e.g., 200 kHz to 4 MHz, e.g., 400 kHz) at a power level between about 500 W and 60 kW (e.g., 4-60 kW), and the plasma generating gas includes at least (a) one or more fluorocarbons and/or hydrofluorocarbons as described herein, and (b) one or more oxidant such as $O_2$. In certain embodiments, the plasma generating gas for the second set of processing conditions further includes $WF_6$. In other embodiments, the plasma generating gas for the second set of processing conditions does not include $WF_6$. As compared to the first set of processing conditions, the second set of processing conditions may have a higher substrate support temperature, a higher power level for exciting the plasma, and/or a higher power level for biasing the substrate. Further, the composition of the plasma generating gas may be different for the two sets of processing conditions.

Figure 4E:
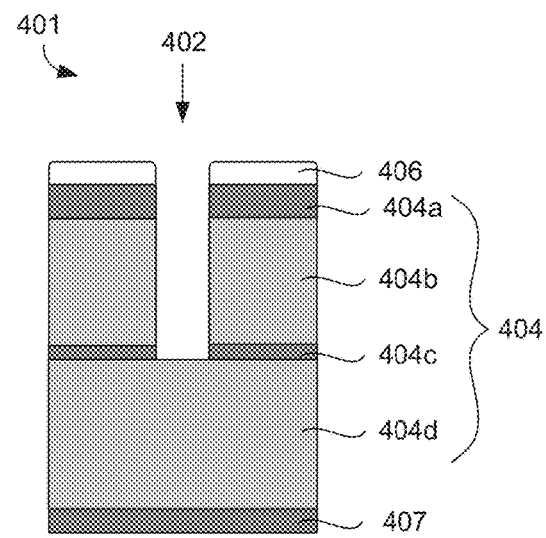

After the second layer 404b of the dielectric stack is etched, the method continues at operation 457 where the third layer 404c of the dielectric stack is etched using a third set of processing conditions, as shown in FIG. 4E. The third set of processing conditions may be optimized for etching the material of the third layer 404c (e.g., silicon nitride). In some cases, these processing conditions may be as described above in relation to the first set of processing conditions (particularly in cases where the material of the first layer is the same as the material of the third layer, e.g., silicon nitride). In certain embodiments, the plasma generating gas for the third set of processing conditions includes $WF_6$. In other embodiments, the plasma generating gas for the third set of processing conditions does not include $WF_6$.

Figure 4F:
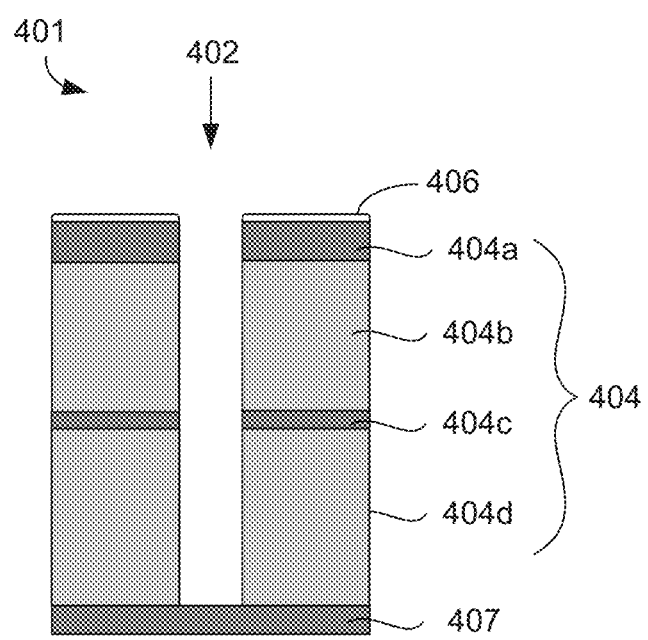

After the third layer 404c of the dielectric stack is etched, the method continues at operation 459 where the fourth layer 404d of the dielectric stack is etched using a fourth set of processing conditions, as shown in FIG. 4F. The fourth set of processing conditions may be optimized for etching the material of the fourth layer 404d (e.g., silicon oxide). In some cases, the fourth set of processing conditions may include processing conditions described above in relation to FIGS. 3A-3C, and/or in relation to the second set of processing conditions. The fourth set of processing conditions will typically use some flow of $WF_6$. After the fourth layer 404d is etched, the feature 402 extends down to the underlying layer 407 (e.g., silicon nitride), as shown in FIG. 4F. The substrate is then removed from the reaction chamber in operation 461.

In various embodiments of the method shown in FIG. 4A, the $WF_6$ is only added to the plasma generating gas in certain etching steps. In one example, the $WF_6$ is only added to the plasma generating gas when etching through silicon oxide layers. In another example, the $WF_6$ is only added to the plasma generating gas when etching through a lower layer of silicon oxide (with an upper layer of silicon oxide being etched without the use of $WF_6$). In another example, $WF_6$ is added to the plasma generating gas only when etching any layers/materials (or any oxide layers/materials) below a certain depth (e.g., when etching at a depth of at least about 50 nm, or at least about 80 nm, with no $WF_6$ being provided to the plasma generating gas before the feature reaches this depth). In a related example, the $WF_6$ is added to the plasma generating gas when etching any layers (or any oxide layers) positioned below a depth that achieves a certain aspect ratio (e.g., when the instant height/width aspect ratio of the partially etched feature is at least about 2.5, or at least about 4). For instance, with reference to FIGS. 4B-4F, $WF_6$ may be added to the plasma generating gas when etching layer 404d, or when etching layers 404c and 404d, or when etching layers 404b, 404c, and 404d, or when etching layers 404b and 404d. This example can be applied to substrates having any number of layers in the dielectric stack 404.

In some embodiments, it may be advantageous to limit which layers are etched using $WF_6$. The $WF_6$ is particularly beneficial when etching high aspect ratio features. As such, in some cases it may be useful to limit the $WF_6$ to etching through layers that are relatively deep within the feature. Relatedly, it may be beneficial in some cases to limit the $WF_6$ to etching through layers of silicon oxide, rather than silicon nitride or other layers. One reason such limits may be beneficial is to minimize reactant costs by using the $WF_6$ only in steps where it provides the greatest improvement in selectivity.

In certain implementations, the method shown in FIG. 4A may be modified by omitting one or more of the initial steps. In such cases, the method may begin by receiving the substrate in the reaction chamber, where the feature is already partially etched into the dielectric stack 404, for example as shown in any of FIGS. 4C-4E.

Apparatus

The methods described herein may be performed by any suitable apparatus. A suitable apparatus includes hardware for accomplishing the process operations and a system controller having instructions for controlling process operations in accordance with the present embodiments. For example, in some embodiments, the hardware may include one or more process stations included in a process tool.

Figure 5A:
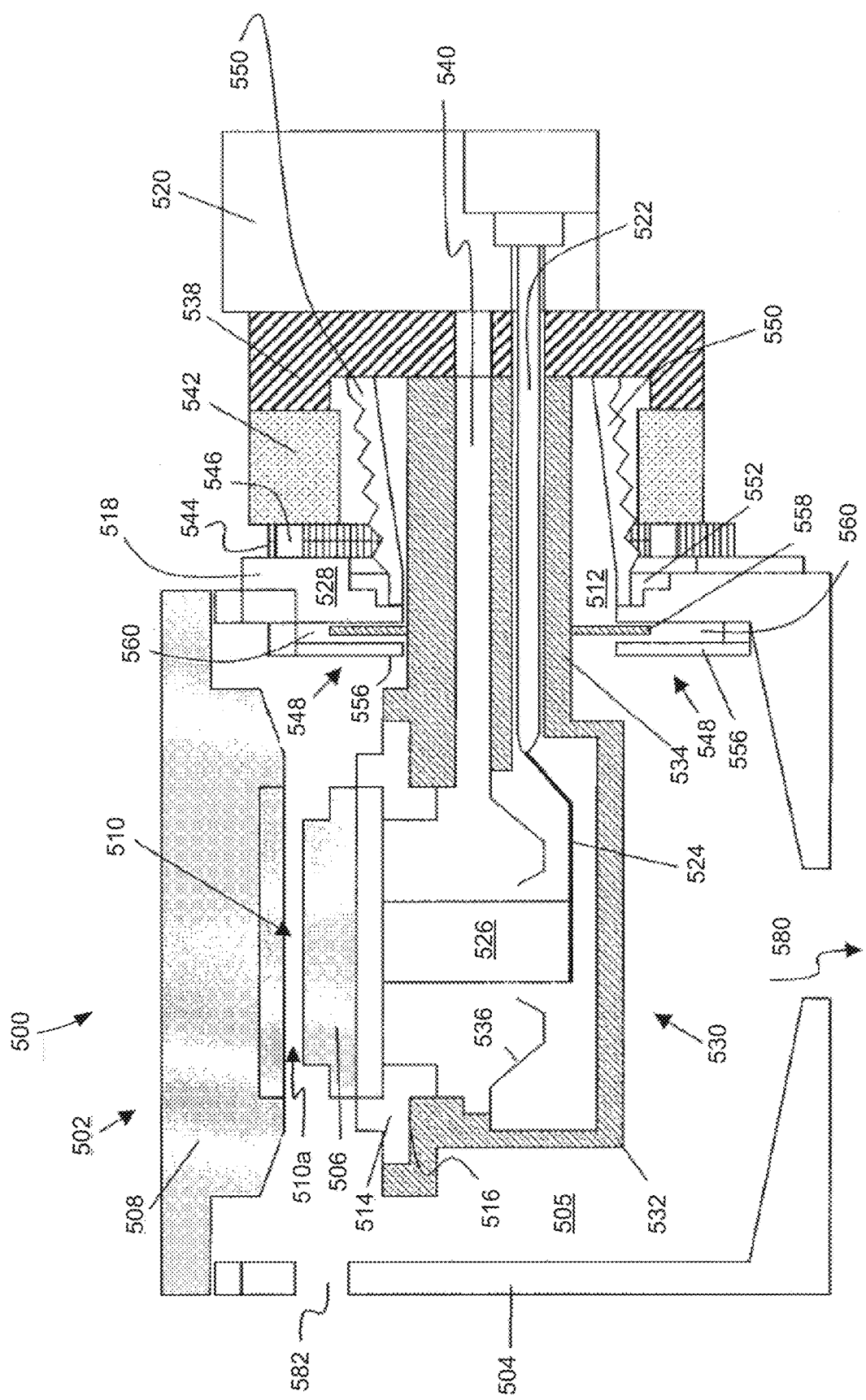
FIGS. 5A-5C illustrate a reaction chamber that may be used to perform the etching processes described herein according to certain embodiments.
Figure 5B:
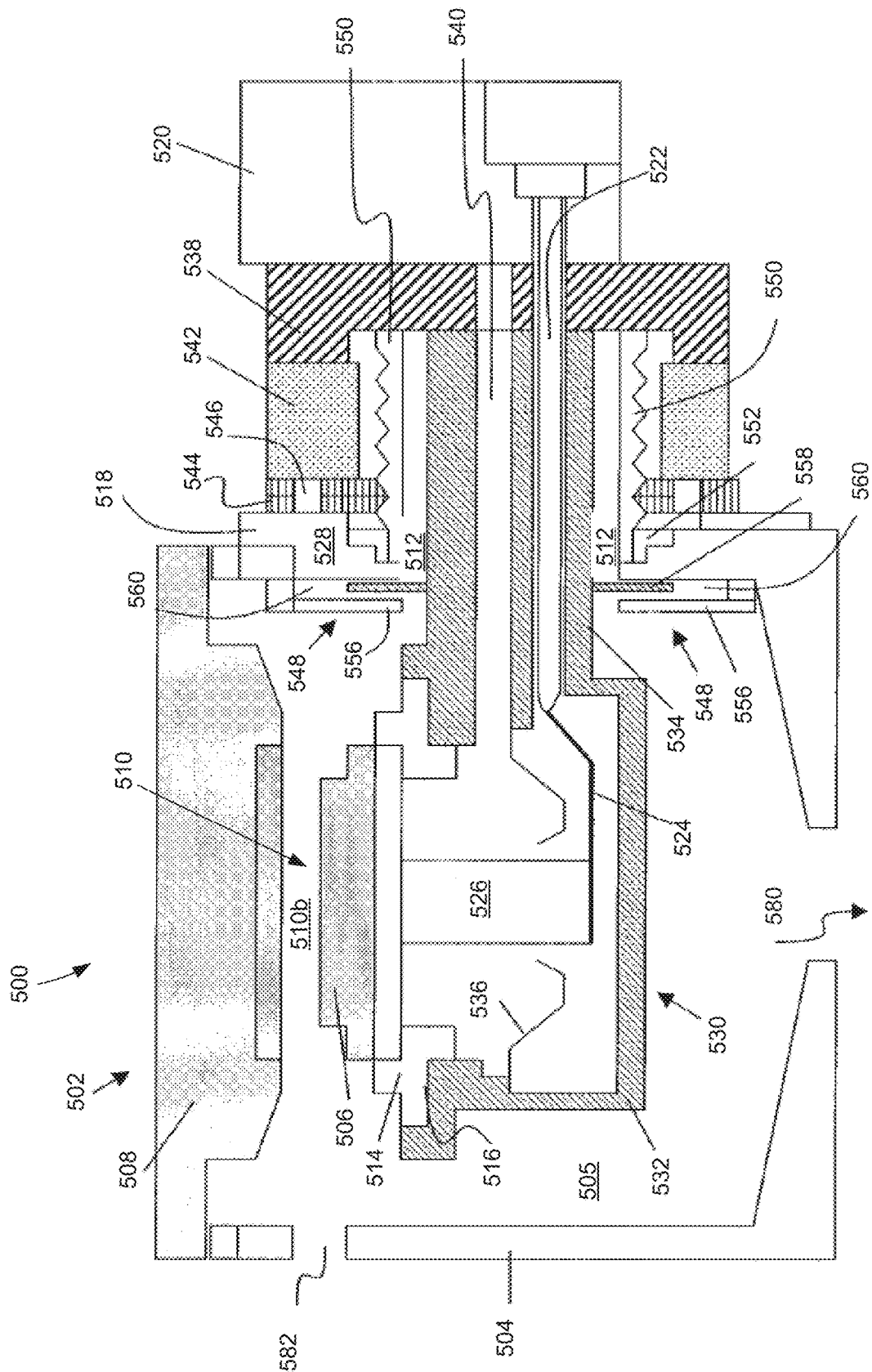
Figure 5C:
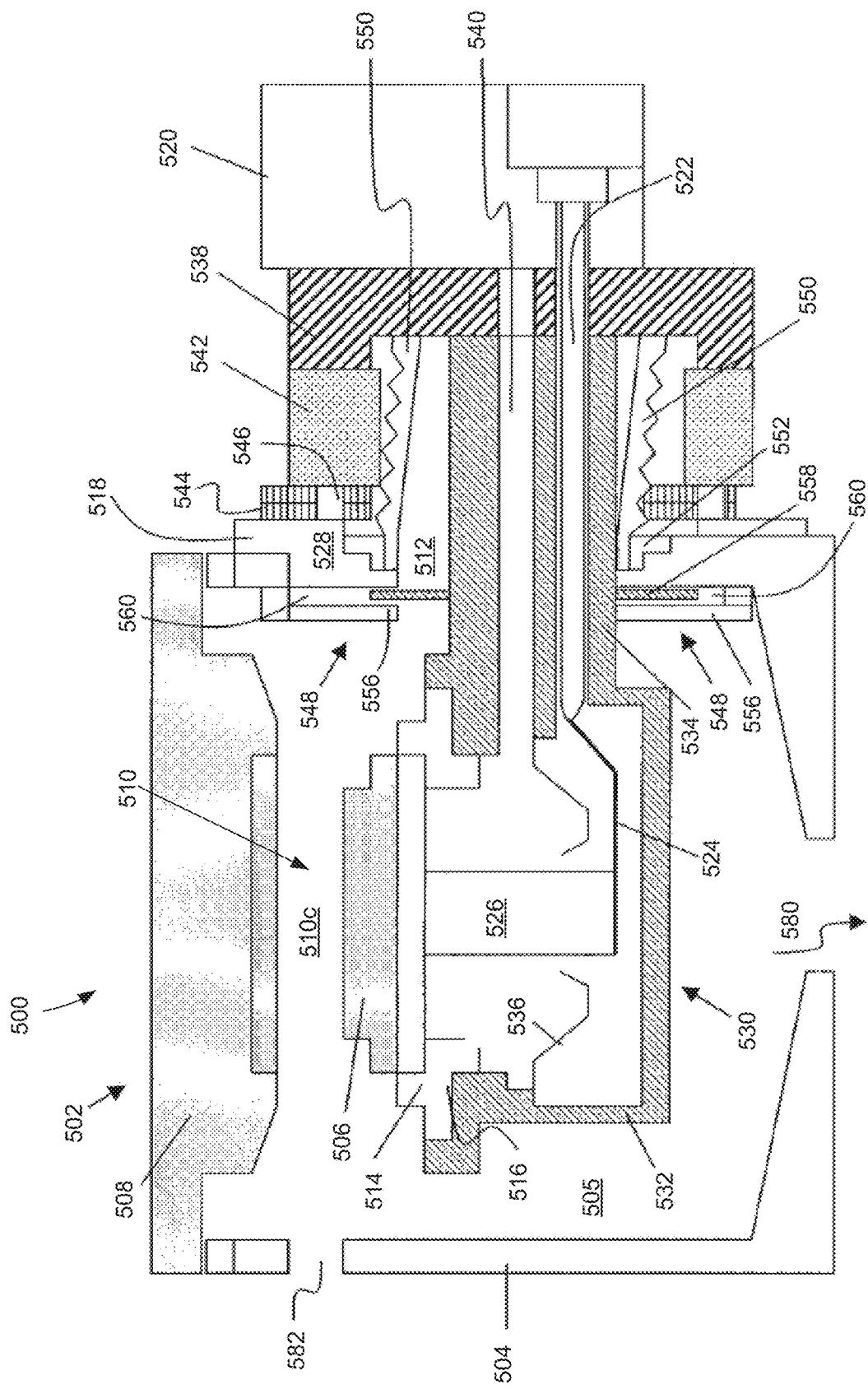

FIGS. 5A-5C illustrate an embodiment of an adjustable gap capacitively coupled confined RF plasma reactor 500 that may be used for performing the etching operations described herein. As depicted, a vacuum chamber 502 includes a chamber housing 504, surrounding an interior space housing a lower electrode 506. In an upper portion of the chamber 502 an upper electrode 508 is vertically spaced apart from the lower electrode 506. Planar surfaces of the upper and lower electrodes 508, 506 are substantially parallel and orthogonal to the vertical direction between the electrodes. Preferably the upper and lower electrodes 508, 506 are circular and coaxial with respect to a vertical axis. A lower surface of the upper electrode 508 faces an upper surface of the lower electrode 506. The spaced apart facing electrode surfaces define an adjustable gap 510 therebetween. During operation, the lower electrode 506 is supplied RF power by an RF power supply (match) 520. RF power is supplied to the lower electrode 506 though an RF supply conduit 522, an RF strap 524 and an RF power member 526. A grounding shield 536 may surround the RF power member 526 to provide a more uniform RF field to the lower electrode 506. As described in commonly-owned U.S. Pat. No. 7,732,728, the entire contents of which are herein incorporated by reference, a wafer is inserted through wafer port 582 and supported in the gap 510 on the lower electrode 506 for processing, a process gas is supplied to the gap 510 and excited into plasma state by the RF power. The upper electrode 508 can be powered or grounded.

In the embodiment shown in FIGS. 5A-5C, the lower electrode 506 is supported on a lower electrode support plate 516. An insulator ring 514 interposed between the lower electrode 506 and the lower electrode Support plate 516 insulates the lower electrode 506 from the support plate 516.

An RF bias housing 530 supports the lower electrode 506 on an RF bias housing bowl 532. The bowl 532 is connected through an opening in a chamber wall plate 518 to a conduit support plate 538 by an arm 534 of the RF bias housing 530. In a preferred embodiment, the RF bias housing bowl 532 and RF bias housing arm 534 are integrally formed as one component, however, the arm 534 and bowl 532 can also be two separate components bolted or joined together.

The RF bias housing arm 534 includes one or more hollow passages for passing RF power and facilities, such as gas coolant, liquid coolant, RF energy, cables for lift pin control, electrical monitoring and actuating signals from outside the vacuum chamber 502 to inside the vacuum chamber 502 at a space on the backside of the lower electrode 506. The RF supply conduit 522 is insulated from the RF bias housing arm 534, the RF bias housing arm 534 providing a return path for RF power to the RF power supply 520. A facilities conduit 540 provides a passageway for facility components. Further details of the facility components are described in U.S. Pat. Nos. 5,948,704 and 7,732,728 and are not shown here for simplicity of description. The gap 510 is preferably surrounded by a confinement ring assembly or shroud (not shown), details of which can be found in commonly owned published U.S. Pat. No. 7,740,736 herein incorporated by reference. The interior of the vacuum chamber 502 is maintained at a low pressure by connection to a vacuum pump through vacuum portal 580.

The conduit support plate 538 is attached to an actuation mechanism 542. Details of an actuation mechanism are described in commonly-owned U.S. Pat. No. 7,732,728 incorporated herein by above. The actuation mechanism 542, such as a servo mechanical motor, stepper motor or the like is attached to a vertical linear bearing 544, for example, by a screw gear 546 such as a ball screw and motor for rotating the ball screw. During operation to adjust the size of the gap 510, the actuation mechanism 542 travels along the vertical linear bearing 544. FIG. 5A illustrates the arrangement when the actuation mechanism 542 is at a high position on the linear bearing 544 resulting in a small gap 510a. FIG. 5B illustrates the arrangement when the actuation mechanism 542 is at a mid position on the linear bearing 544. As shown, the lower electrode 506, the RF bias housing 530, the conduit support plate 538, the RF power supply 520 have all moved lower with respect to the chamber housing 504 and the upper electrode 508, resulting in a medium size gap 510b.

FIG. 5C illustrates a large gap 510c when the actuation mechanism 542 is at a low position on the linear bearing. Preferably, the upper and lower electrodes 508, 506 remain coaxial during the gap adjustment and the facing surfaces of the upper and lower electrodes across the gap remain parallel.

This embodiment allows the gap 510 between the lower and upper electrodes 506, 508 in the CCP chamber 502 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 506, 508.

FIG. 5A illustrates laterally deflected bellows 550 sealed at a proximate end to the conduit support plate 538 and at a distal end to a stepped flange 528 of chamber wall plate 518. The inner diameter of the stepped flange defines an opening 512 in the chamber wall plate 518 through which the RF bias housing arm 534 passes. The distal end of the bellows 550 is clamped by a clamp ring 552.

The laterally deflected bellows 550 provides a vacuum seal while allowing vertical movement of the RF bias housing 530, conduit support plate 538 and actuation mechanism 542. The RF bias housing 530, conduit support plate 538 and actuation mechanism 542 can be referred to as a cantilever assembly. Preferably, the RF power supply 520 moves with the cantilever assembly and can be attached to the conduit support plate 538. FIG. 5B shows the bellows 550 in a neutral position when the cantilever assembly is at a mid position. FIG. 5C shows the bellows 550 laterally deflected when the cantilever assembly is at a low position.

A labyrinth seal 548 provides a particle barrier between the bellows 550 and the interior of the plasma processing chamber housing 504. A fixed shield 556 is immovably attached to the inside inner wall of the chamber housing 504 at the chamber wall plate 518 so as to provide a labyrinth groove 560 (slot) in which a movable shield plate 558 moves vertically to accommodate vertical movement of the cantilever assembly. The outer portion of the movable shield plate 558 remains in the slot at all vertical positions of the lower electrode 506.

In the embodiment shown, the labyrinth seal 548 includes a fixed shield 556 attached to an inner surface of the chamber wall plate 518 at a periphery of the opening 512 in the chamber wall plate 518 defining a labyrinth groove 560. The movable shield plate 558 is attached and extends radially from the RF bias housing arm 534 where the arm 534 passes through the opening 512 in the chamber wall plate 518. The movable shield plate 558 extends into the labyrinth groove 560 while spaced apart from the fixed shield 556 by a first gap and spaced apart from the interior surface of the chamber wall plate 518 by a second gap allowing the cantilevered assembly to move vertically. The labyrinth seal 548 blocks migration of particles spalled from the bellows 550 from entering the vacuum chamber interior 505 and blocks radicals from process gas plasma from migrating to the bellows 550 where the radicals can form deposits which are subsequently spalled.

FIG. 5A shows the movable shield plate 558 at a higher position in the labyrinth groove 560 above the RF bias housing arm 534 when the cantilevered assembly is in a high position (small gap 510a). FIG. 5C shows the movable shield plate 558 at a lower position in the labyrinth groove 560 above the RF bias housing arm 534 when the cantilevered assembly is in a low position (large gap 510c). FIG. 5B shows the movable shield plate 558 in a neutral or mid position within the labyrinth groove 560 when the cantilevered assembly is in a mid position (medium gap 510b). While the labyrinth seal 548 is shown as symmetrical about the RF bias housing arm 534, in other embodiments the labyrinth seal 548 may be asymmetrical about the RF bias arm 534.

Figure 6:
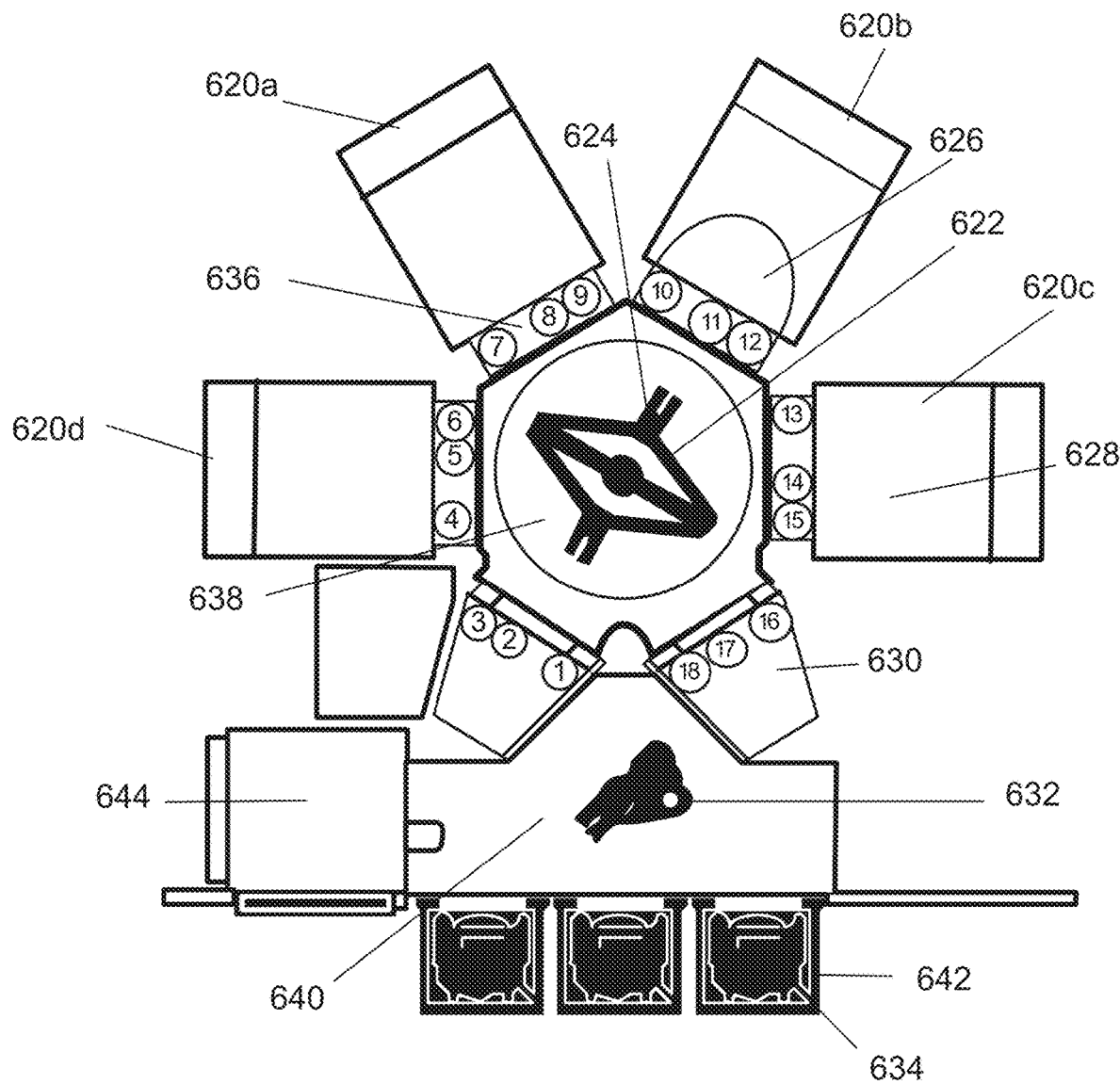
FIG. 6 shows a cluster tool that may be used to practice certain embodiments.

FIG. 6 depicts a semiconductor process cluster architecture with various modules that interface with a vacuum transfer module 638 (VTM). The arrangement of transfer modules to "transfer" substrates among multiple storage facilities and processing modules may be referred to as a "cluster tool architecture" system. Airlock 630, also known as a loadlock or transfer module, is shown in VTM 638 with four processing modules 620a-620d, which may be individually optimized to perform various fabrication processes. By way of example, processing modules 620a-620d may be implemented to perform substrate etching, deposition, ion implantation, substrate cleaning, sputtering, and/or other semiconductor processes as well as laser metrology and other defect detection and defect identification methods. One or more of the processing modules (any of 620a-620d) may be implemented as disclosed herein, i.e., for etching recessed features into substrates. Airlock 630 and process modules 620a-620d may be referred to as "stations." Each station has a facet 636 that interfaces the station to VTM 638. Inside the facets, sensors 1-18 are used to detect the passing of substrate 626 when moved between respective stations.

Robot 622 transfers substrates between stations. In one implementation, the robot may have one arm, and in another implementation, the robot may have two arms, where each arm has an end effector 624 to pick substrates for transport.

Front-end robot 632, in atmospheric transfer module (ATM) 640, may be used to transfer substrates from cassette or Front Opening Unified Pod (FOUP) 634 in Load Port Module (LPM) 642 to airlock 630. Module center 628 inside process modules 620a-620d may be one location for placing the substrate. Aligner 644 in ATM 640 may be used to align substrates.

In an exemplary processing method, a substrate is placed in one of the FOUPs 634 in the LPM 642. Front-end robot 632 transfers the substrate from the FOUP 634 to the aligner 644, which allows the substrate 626 to be properly centered before it is etched, or deposited upon, or otherwise processed. After being aligned, the substrate is moved by the front-end robot 632 into an airlock 630. Because airlock modules have the ability to match the environment between an ATM and a VTM, the substrate is able to move between the two pressure environments without being damaged. From the airlock module 630, the substrate is moved by robot 622 through VTM 638 and into one of the process modules 620a-620d, for example process module 620a. In order to achieve this substrate movement, the robot 622 uses end effectors 624 on each of its arms. In process module 620a, the substrate undergoes etching as described. Next, the robot 622 moves the substrate out of processing module 620a to its next desired position.

It should be noted that the computer controlling the substrate movement can be local to the cluster architecture, or can be located external to the cluster architecture in the manufacturing floor, or in a remote location and connected to the cluster architecture via a network.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EXPERIMENTAL

Experimental results have shown that addition of $WF_6$ to etch chemistry can increase both the rate at which a feature is etched and the selectivity with which the feature is etched. The results also show that these benefits can be attained without any increase in capping. Because of the relationship typically observed between selectivity and capping (e.g., as described in relation to FIG. 2B), these results were unexpected and surprising.

Figure 7A:
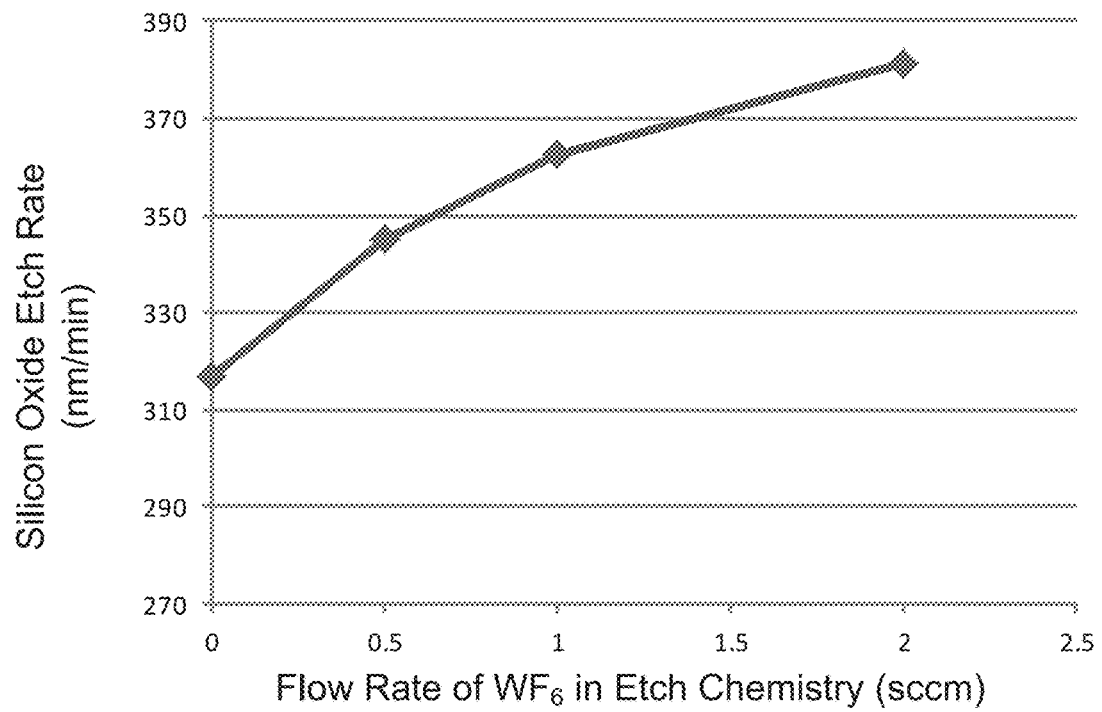
FIG. 7A is a graph describing the silicon oxide etch rate as a function of $WF_6$ flow on an unpatterned substrate.

FIG. 7A depicts the etch rate achieved for various substrates using etch chemistry having differing amounts of $WF_6$. In this example, the substrates had an unpatterned blanket layer of silicon oxide thereon. For each case, the etch chemistry included a combination of $C_4F_6$, $CH_2F_2$, $C_4F_8$, $O_2$, and $NF_3$. The flow rate of $WF_6$ ranged from 0-2.0 sccm. As shown in FIG. 7A, the addition of $WF_6$ to the etch chemistry increases the silicon oxide etch rate.

Figure 7B:
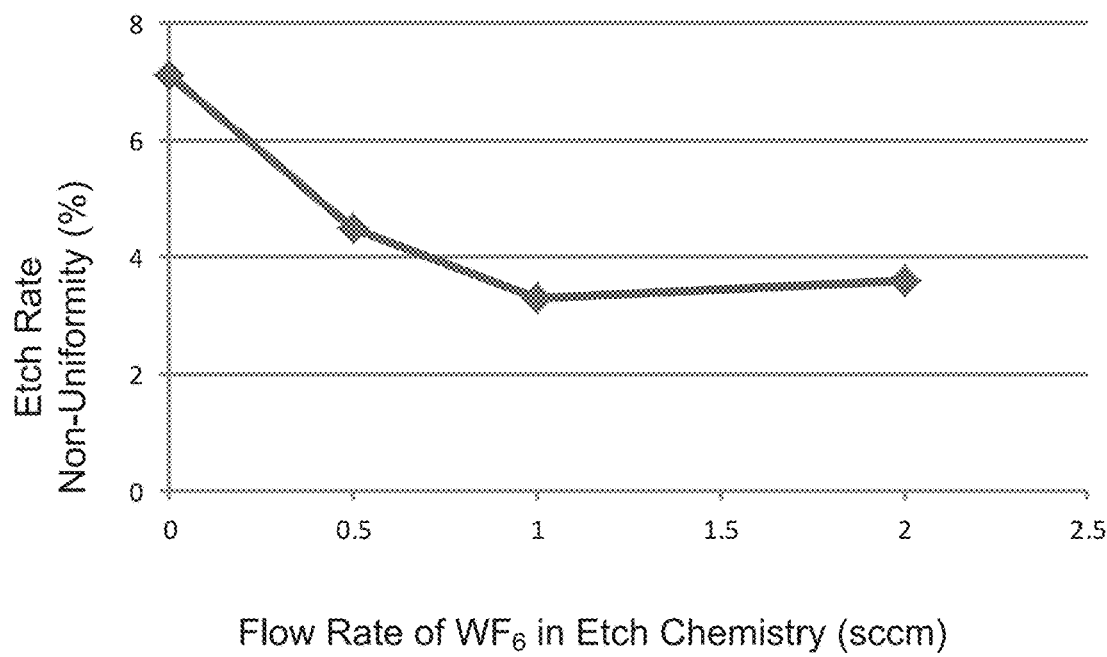
FIG. 7B is a graph describing the non-uniformity observed as a function of $WF_6$ flow on an unpatterned substrate.

FIG. 7B shows the etch rate non-uniformity achieved for the substrates tested in connection with FIG. 7A. The etch rate non-uniformity reported here is calculated as three sigma divided by the average etch rate (three sigma being three times the standard deviation of the etch rate among the tested locations). The results indicate that the addition of $WF_6$ decreases the non-uniformity of the etch rate. This decrease in non-uniformity is advantageous, as it means that the etch results are more uniform across the surface of the substrate.

Figure 8A:
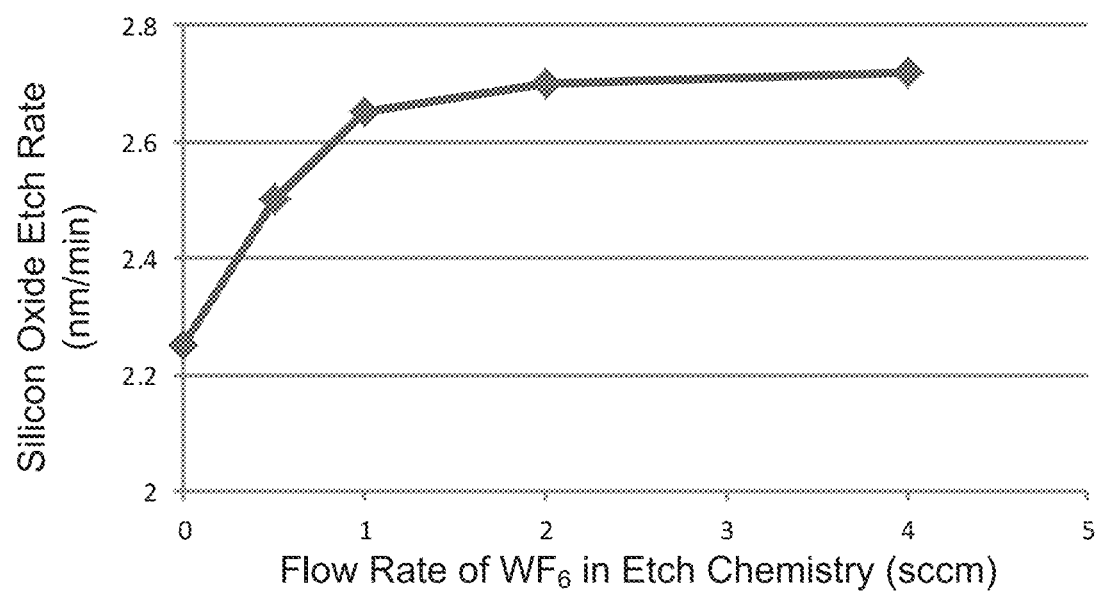
FIG. 8A is a graph describing the silicon oxide etch rate as a function of $WF_6$ flow on a patterned substrate.
Figure 8B:
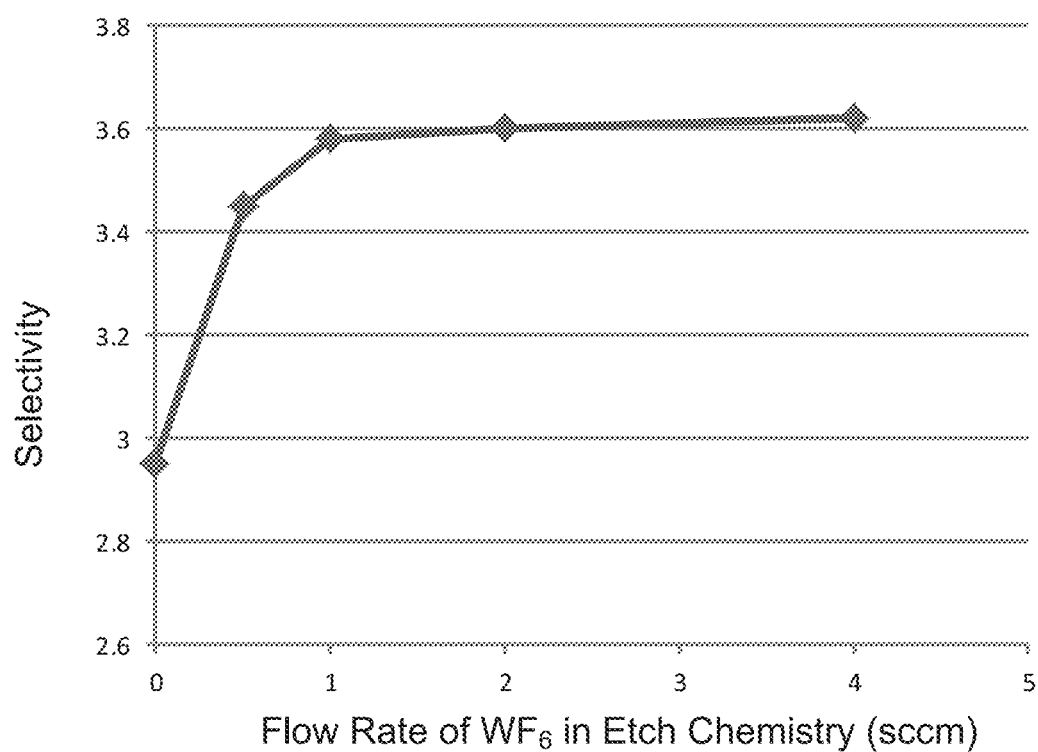
FIG. 8B is a graph describing the etch selectivity achieved as a function of $WF_6$ flow on a patterned substrate.

FIGS. 8A and 8B compare the etch rate (FIG. 8A) and selectivity (FIG. 8B) achieved at different flow rates of $WF_6$. The substrates in this example included a dielectric stack of silicon oxide and silicon nitride that was already partially etched (e.g., to a depth of approximately 85 nm), for example as shown in FIG. 4E. The etch process etched through a layer of silicon oxide in the dielectric stack. The mask material was polysilicon. The etch chemistry in this example included a combination of $C_4F_6$, $CH_2F_2$, $C_4F_8$, $O_2$, and $NF_3$. In the case where $WF_6$ was omitted from the etch chemistry, the oxide etch rate was approximately 2.25 nm/min and the selectivity was approximately 2.95. This means that the silicon oxide etched at a rate of approximately 2.25 nm/min, while the mask material etched at a rate of approximately 0.76 nm/min. In the case where $WF_6$ was included in the etch chemistry at a flow rate of about 0.5 sccm, the oxide etch rate increased to approximately 2.5 nm/min, and the selectivity increased to approximately 3.45. This means that the silicon oxide etch rate increased to about 2.5 nm/min while the mask material etch rate decreased to about 0.72 nm/min. Both of these etch rate changes are beneficial in terms of achieving an increased selectivity.

FIGS. 8A and 8B show that the benefits related to the addition of $WF_6$ to the etch chemistry (e.g., increase in oxide etch rate and increase in selectivity) occur even at very low $WF_6$ flow rates. Further, FIGS. 8A and 8B show that these benefits begin to plateau at a relatively low flow rate of $WF_6$. For the particular substrates/features tested in relation to FIGS. 8A and 8B, the benefits are substantially achieved at a flow rate of approximately 1 sccm. Minor improvements can be seen at higher $WF_6$ flow rates, but it appears that relatively little $WF_6$ is needed to achieve most of the potential improvement. The desired range for the flow of $WF_6$ may vary in other cases, for example where the substrate has features of different dimensions, or where the substrate has a dielectric stack including materials different from those tested in relation to FIGS. 8A and 8B.

A number of experiments were performed to evaluate whether the techniques described herein would lead to an increase in capping. Such an increase was expected because techniques that increase the selectivity of the etch typically also lead to an increase in capping, as explained in relation to FIGS. 2A and 2B. As described above, capping occurs when a feature becomes clogged/blocked, such that it cannot be further etched.

Figure 9:
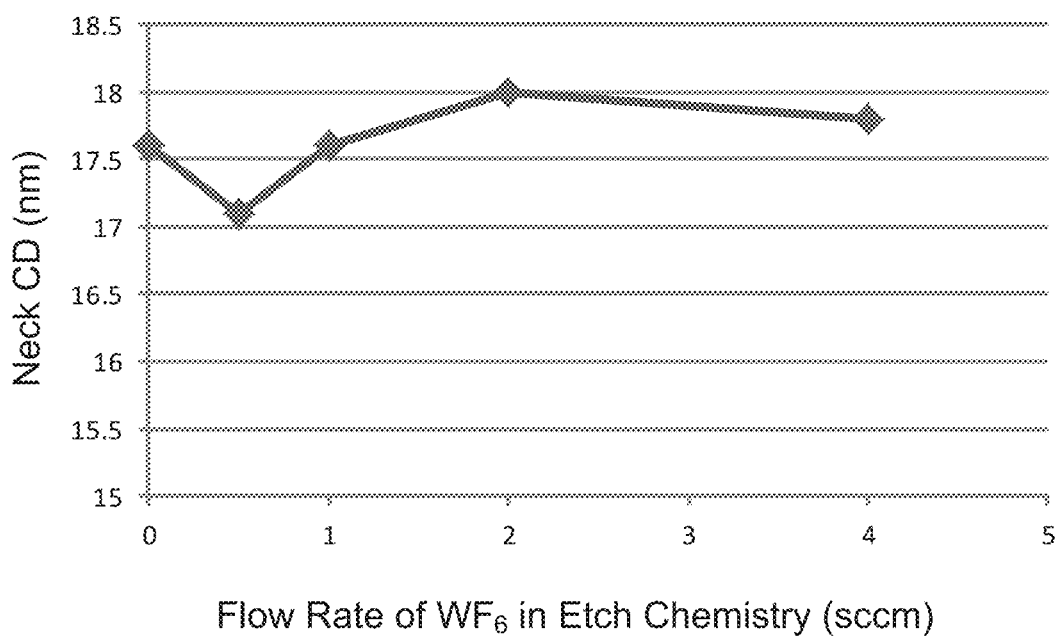
FIG. 9 presents data related to neck CD as a function of $WF_6$ flow on a patterned substrate.

FIG. 9 presents data related to the final neck CD as a function of the $WF_6$ flow in the etch chemistry. The substrates tested in relation to FIG. 9 are the same as those tested in relation to FIGS. 8A and 8B. The results in FIG. 9 show that the addition of $WF_6$ to the etch chemistry does not lead to a significant decrease in final neck CD. The final neck CD refers to the critical dimension (e.g., diameter) of the feature at its opening/neck after the feature is etched. The final neck CD of a feature that has become capped during etching is 0, meaning that there is no opening left. Where capping occurs, the final neck CD is relatively lower (assuming the same starting neck CD prior to etching). Similarly, a lower final neck CD corresponds to a higher rate of capping. FIG. 9 shows that there was a slight decrease in neck CD when moving from no $WF_6$ to 0.5 sccm $WF_6$. However, this effect was fairly mild, and was not seen at slightly higher $WF_6$ flow rates of 1, 2, or 4 sccm. Thus, it can be seen that the addition of $WF_6$ does not lead to an increase in capping.

Figure 10:
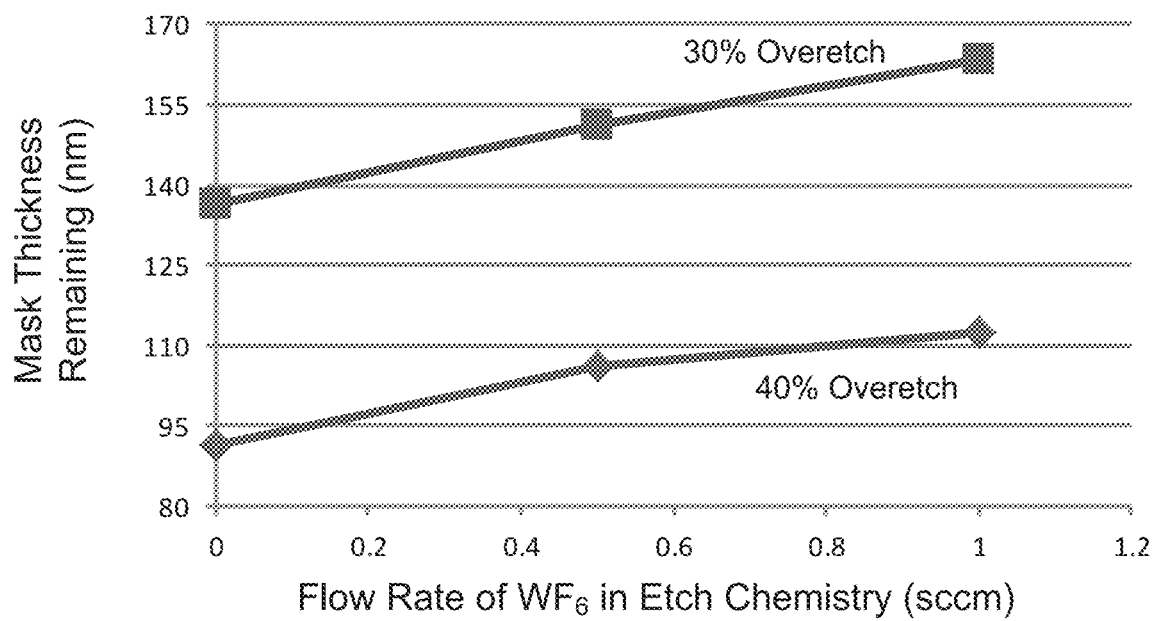
FIG. 10 presents data describing the mask thickness remaining as a function of $WF_6$ flow after the substrates were overetched to a particular degree.

Further experiments were performed to evaluate the effect of an addition of $WF_6$ to the etch chemistry in a case where the features are overetched by approximately 30% or 40%. Overetching is commonly performed to ensure that all of the features reach the final desired depth, and to widen the critical dimension (e.g., diameter) of the bottom of the feature (e.g., such that the feature is more rectangular and less tapered). FIG. 10 shows the results of these experiments. Specifically, FIG. 10 shows the thickness of mask material remaining after the overetching process is complete. The mask thickness prior to the etch was about 390 nm. Where $WF_6$ is included in the etching chemistry, more of the mask is preserved during the etching process. This was true for both the 30% overetch and the 40% overetch. These results indicate that the techniques described herein can be used to form features at a particular etch depth using less mask thickness than was previously required. Similarly, the techniques can be used to form deeper features at a particular mask thickness.

Additional Embodiments

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed. Certain references have been incorporated by reference herein. It is understood that any disclaimers or disavowals made in such references do not necessarily apply to the embodiments described herein. Similarly, any features described as necessary in such references may be omitted in the embodiments herein.

The subject matter of the present disclosure includes all novel and nonobvious combinations and sub-combinations of the various processes, systems and configurations, and other features, functions, acts, and/or properties disclosed herein, as well as any and all equivalents thereof.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The above detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like. Unless otherwise defined for a particular parameter, the terms "about" and "approximately" as used herein are intended to mean±10% with respect to a relevant value.

In the above description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it is understood that it is not intended to limit the disclosed embodiments.

What is claimed is:

1. A method of etching a feature in dielectric material on a substrate while fabricating a memory structure, the method comprising:

receiving the substrate on a substrate support in a reaction chamber, the substrate comprising the dielectric material under a mask layer that is patterned, the dielectric material comprising silicon oxide; and exposing the substrate to a plasma in the reaction chamber to thereby etch the feature in the dielectric material on the substrate, wherein the plasma is generated from a plasma generating gas comprising $WF_6$, one or more fluorocarbons, and oxygen ($O_2$), wherein the plasma is a capacitively-coupled plasma and the substrate is biased, wherein the substrate support is maintained at a temperature between about −80° C. and 130° C. while the substrate is exposed to the plasma, and wherein the $WF_6$ dissociates in the plasma into tungsten-containing fragments and fluorine-containing fragments, and wherein the substrate is biased and exposed to the capacitively-coupled plasma under conditions such that the tungsten-containing fragments preferentially attach to upper sidewalls of the feature compared to lower sidewalls of the feature and the fluorine-containing fragments travel to the bottom of the feature to further etch the feature.

2. The method of claim 1, wherein the $WF_6$ in the plasma generating gas is about 1% or less of a volumetric flow rate of the plasma generating gas.

3. The method of claim 1, wherein the $WF_6$ in the plasma generating gas is at least about 0.05% of a volumetric flow rate of the plasma generating gas.

4. The method of claim 1, wherein the plasma is generated at an excitation frequency between about 13 MHz and about 169 MHz at an RF power level between about 5 kW and about 20 kW per substrate.

5. The method of claim 1, wherein the substrate is biased at a frequency between about 50 kHz and about 10 MHz at an RF power level between about 500 W and about 60 kW per substrate.

6. The method of claim 1, wherein the reaction chamber is maintained at a temperature between about 10 mTorr and about 500 mTorr during etching.

7. The method of claim 1, wherein the substrate is maintained at a temperature between about 60° C. and about 120° C. while the substrate is exposed to the plasma.

8. The method of claim 1, wherein a flow rate of $WF_6$ in the plasma generating gas is about 20 sccm or less.

9. The method of claim 1, wherein the method occurs without capping any features of the substrate.

10. The method of claim 9, wherein a selectivity of the etch is at least about 3.0, the selectivity being defined as an etch rate of the silicon oxide divided by an etch rate of the mask layer, wherein the mask layer comprises polysilicon.

11. The method of claim 1, wherein the substrate is biased and exposed to the capacitively-coupled plasma under conditions such that the tungsten-containing fragments preferentially attach to regions of the feature proximate the mask layer.

12. The method of claim 1, wherein the dielectric material is provided in a dielectric stack comprising at least a first layer of silicon oxide and at least a first layer of silicon nitride, the first layer of silicon oxide being positioned below the first layer of silicon nitride, wherein the first layer of silicon nitride is etched prior to exposing the substrate to the plasma comprising the $WF_6$ to etch the first layer of silicon oxide.

13. The method of claim 12, further comprising:
   etching the first layer of silicon nitride without the use of $WF_6$, prior to etching the first layer of silicon oxide.

14. The method of claim 1, wherein the one or more fluorocarbons include $C_3F_8$, $C_4F_8$, $C_4F_6$, $CH_2F_2$, $CH_3F$, $CHF_3$, $C_5F_8$, $C_6F_6$, or combinations thereof.

15. A method of etching a feature in dielectric material on a substrate while fabricating a memory structure, the method comprising:

receiving the substrate on a substrate support in a reaction chamber, the substrate comprising the dielectric material under a mask layer that is patterned, the dielectric material comprising silicon oxide, wherein the dielectric material is provided in a dielectric stack comprising at least a first layer of silicon oxide, at least a first layer of silicon nitride, and at least a second layer of silicon oxide, the first layer of silicon oxide being positioned below the first layer of silicon nitride and the second layer of silicon oxide being positioned above the first layer of silicon nitride;

etching the second layer of silicon oxide without $WF_6$ prior to etching the first layer of silicon nitride;

etching the first layer of silicon nitride without $WF_6$ prior to etching the first layer of silicon oxide; and etching the first layer of silicon oxide by exposing the substrate to a plasma in the reaction chamber to thereby etch the feature in the dielectric material on the substrate, wherein the plasma is generated from a plasma generating gas comprising $WF_6$, one or more fluorocarbons, and oxygen ($O_2$), wherein the plasma is a capacitively-coupled plasma and the substrate is biased, wherein the substrate support is maintained at a temperature between about −80° C. and 130° C. while the substrate is exposed to the plasma.

16. The method of claim 15, wherein the $WF_6$ in the plasma generating gas is about 1% or less of a volumetric flow rate of the plasma generating gas.

17. The method of claim 15, wherein etching the first layer of silicon oxide occurs at a higher substrate support temperature, a higher power level for exciting plasma, and a higher power level for biasing the substrate than etching the first layer of silicon nitride.

18. The method of claim 15, wherein the plasma is generated at an excitation frequency between about 13 MHz and about 169 MHz at an RF power level between about 5 kW and about 20 kW per substrate when etching the first layer of silicon oxide.

19. The method of claim 15, wherein the substrate is biased at a frequency between about 50 kHz and about 10 MHz at an RF power level between about 500 W and about 60 kW per substrate when etching the first layer of silicon oxide.

20. The method of claim 15, wherein the substrate is biased and exposed to the capacitively-coupled plasma under conditions such that the tungsten-containing fragments preferentially attach to upper sidewalls of the feature compared to lower sidewalls of the feature and the fluorine-containing fragments travel to the bottom of the feature to further etch the feature when etching the first layer of silicon oxide.

* * * * *